(12) United States Patent
Liu et al.

(10) Patent No.: US 9,871,132 B1
(45) Date of Patent: Jan. 16, 2018

(54) EXTENDED DRAIN METAL-OXIDE-SEMICONDUCTOR TRANSISTOR

(71) Applicant: GLOBALFOUNDRIES Singapore Pte. Ltd., Singapore (SG)

(72) Inventors: Kun Liu, Singapore (SG); Xiaoping Wang, Singapore (SG); Francis Lionel Benistant, Singapore (SG); Li Cao, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/236,494

(22) Filed: Aug. 15, 2016

(51) Int. Cl.
| | |
|---|---|
| *H01L 29/78* | (2006.01) |
| *H01L 29/40* | (2006.01) |
| *H01L 29/417* | (2006.01) |
| *H01L 29/66* | (2006.01) |
| *H01L 21/768* | (2006.01) |
| *H01L 29/10* | (2006.01) |

(52) U.S. Cl.
CPC .... *H01L 29/7816* (2013.01); *H01L 21/76897* (2013.01); *H01L 29/1095* (2013.01); *H01L 29/401* (2013.01); *H01L 29/402* (2013.01); *H01L 29/41758* (2013.01); *H01L 29/66659* (2013.01); *H01L 29/66681* (2013.01)

(58) Field of Classification Search
CPC ........... H01L 29/7816; H01L 21/76897; H01L 29/1095; H01L 29/401; H01L 29/402; H01L 29/41758; H01L 29/66659; H01L 29/66681
See application file for complete search history.

(56) References Cited

U.S. PATENT DOCUMENTS

| | | | | |
|---|---|---|---|---|
| 6,166,428 | A * | 12/2000 | Mehta | H01L 21/28273 257/315 |
| 7,208,364 | B2 | 4/2007 | Pan et al. | |
| 2014/0048858 | A1* | 2/2014 | Satoh | H01L 29/78 257/288 |
| 2014/0231911 | A1* | 8/2014 | Kim | H01L 29/66681 257/339 |
| 2014/0342520 | A1* | 11/2014 | Su | H01L 21/823487 438/273 |

* cited by examiner

*Primary Examiner* — Peter Bradford
(74) *Attorney, Agent, or Firm* — Horizon IP PTE Ltd.

(57) ABSTRACT

Devices and methods for forming a device are disclosed. A transistor is formed on the substrate. The transistor includes a gate, a source and a drain. An insulation layer is formed on the substrate. The insulation layer is partially disposed on the gate and a sidewall of the gate. The drain is offset from the gate by the insulation layer. An overlayer is formed on the substrate covering the transistor and insulation layer. A field plate in the form of a field plate contact is formed in the overlayer. The field plate contact is disposed on and coupled to the insulation layer for mitigating the formation of electric field adjacent to drain side of the gate.

19 Claims, 11 Drawing Sheets

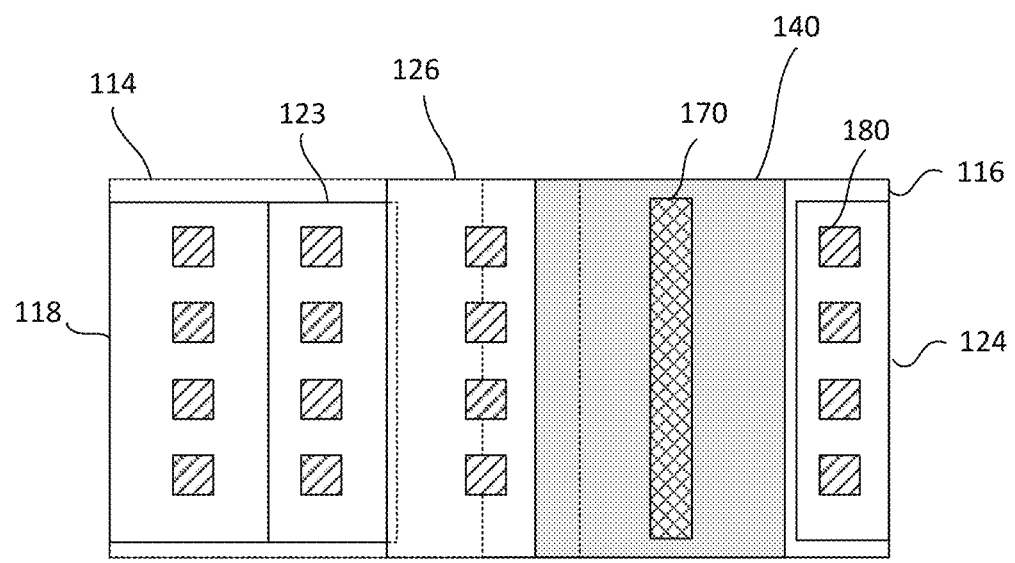
Fig. 2a
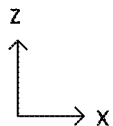

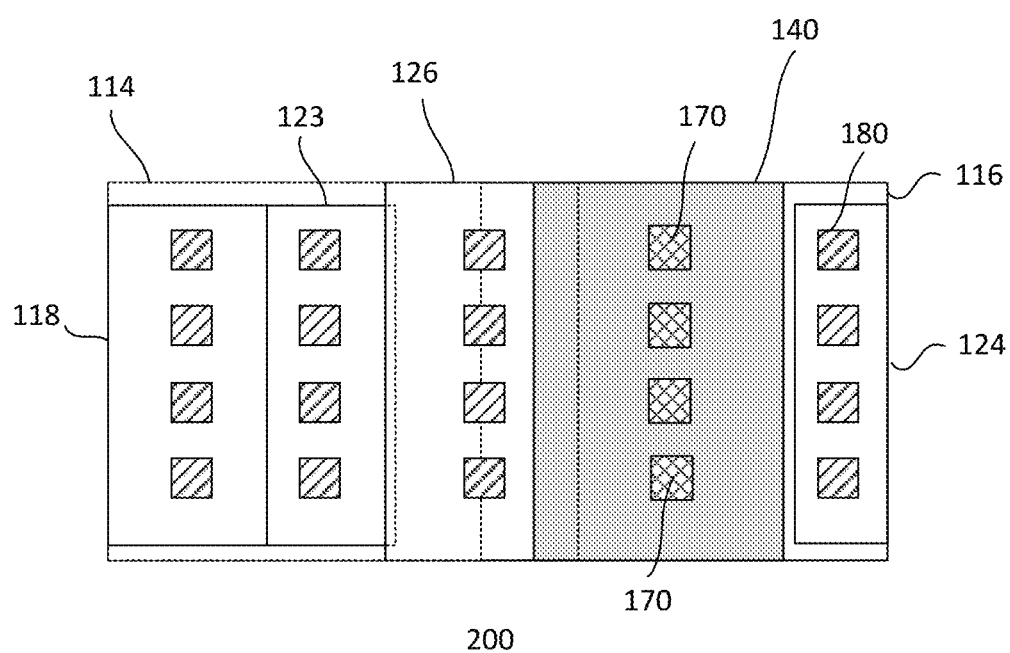
Fig. 2b
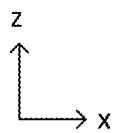

EXTENDED DRAIN METAL-OXIDE-SEMICONDUCTOR TRANSISTOR

BACKGROUND

A foundry based Bipolar-CMOS-DMOS (BCD) technology typically includes a full suite of devices having a wide range of operation voltages. For example, in a 180 nm BCD platform, operation voltages such as 1.8V, 5V, 10V, 12V, 16V, 20V, 24V and 30V are provided to satisfy different applications in automotive, audio, display, etc.

Depending on the BCD operation platforms, the various devices are typically categorized according to their operational voltage. By way of an example, devices operate in the relatively higher voltage range, e.g., 24V and above, may be referred to as the high voltage (HV) devices. Such HV devices include laterally diffused metal oxide semiconductor (LDMOS) transistors. Devices operate in the relatively lower voltage range, e.g., low as 1.8V/5V, may be referred to as the low voltage (LV) devices, such as the complementary metal-oxide-semiconductor (CMOS) transistors. Devices which fall between the higher and lower voltage ranges may be referred to as the intermediate/medium voltage (MV) devices, e.g., 10V to 20V. An example of the MV devices is the extended drain MOS (EDMOS) transistor.

Two types of doped wells, namely the LV doped well and HV doped well, are usually provided for the devices, taking into considerations of the cost effectiveness. Typically, performance of the HV and LV devices can be directly optimized by utilizing the aforementioned doped wells. For example, a HV doped well is typically provided for optimizing the performance of HV devices and a LV doped well for the LV devices. However, optimizing MV devices can only be relied on the device structure designs.

The present disclosure provides a structure design which optimizes the performance of a MV device and a method for forming such a MV device.

SUMMARY

Embodiments of the present disclosure generally relate to semiconductor device and method for forming a semiconductor device. In one embodiment, a method for forming a device is disclosed. The method includes forming a transistor on the substrate. The transistor includes a gate, a source and a drain. An insulation layer is formed on the substrate. The insulation layer is partially disposed on the gate and a sidewall of the gate. The drain is offset from the gate by the insulation layer. An overlayer is formed on the substrate covering the transistor and insulation layer. A field plate in the form of a field plate contact is formed in the overlayer. The field plate contact is disposed on and coupled to the insulation layer for mitigating the formation of electric field adjacent to drain side of the gate.

In one embodiment, a method for forming a device is disclosed. The method includes forming a transistor on the substrate. The transistor includes a gate. An insulation layer is formed on the substrate. The insulation layer is partially disposed on the gate and a sidewall of the gate. An etch stop layer is formed on the substrate. The etch stop layer covers the transistor. A dielectric layer is formed over the etch stop layer. A field plate in the form of a field plate contact is formed in the etch stop layer and dielectric layer. The field plate contact is disposed on and coupled to the insulation layer.

In another embodiment, a device is disclosed. The device includes a transistor disposed on the substrate. The transistor includes a gate, a source and a drain. An insulation layer is disposed on the substrate. The insulation layer is partially disposed on the gate and a sidewall of the gate. The drain is offset from the gate by the insulation layer. The device includes an overlayer disposed on the substrate covering the transistor and insulation layer. The device also includes a field plate in the form of a field plate contact disposed in the overlayer. The field plate contact is disposed on and coupled to the insulation layer for mitigating the formation of electric field adjacent to drain side of the gate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 2a-2b show simplified plan views of various embodiments of a device; and

DETAILED DESCRIPTION

Embodiments generally relate to semiconductor devices or integrated circuits (ICs). More particularly, some embodiments relate to intermediate (medium) voltage (MV) devices. For example, intermediate voltage devices include extended drain (ED) transistors, such as extended drain metal oxide (EDMOS) transistors. The MV devices can be employed as switching voltage regulators for power management applications. The EDMOS transistors can be easily integrated into devices or ICs. The devices or ICs can be incorporated into or used with, for example, consumer electronic products, particularly portable consumer products, such as cell phones, laptop computers and personal digital assistants (PDAs).

Figure 1:
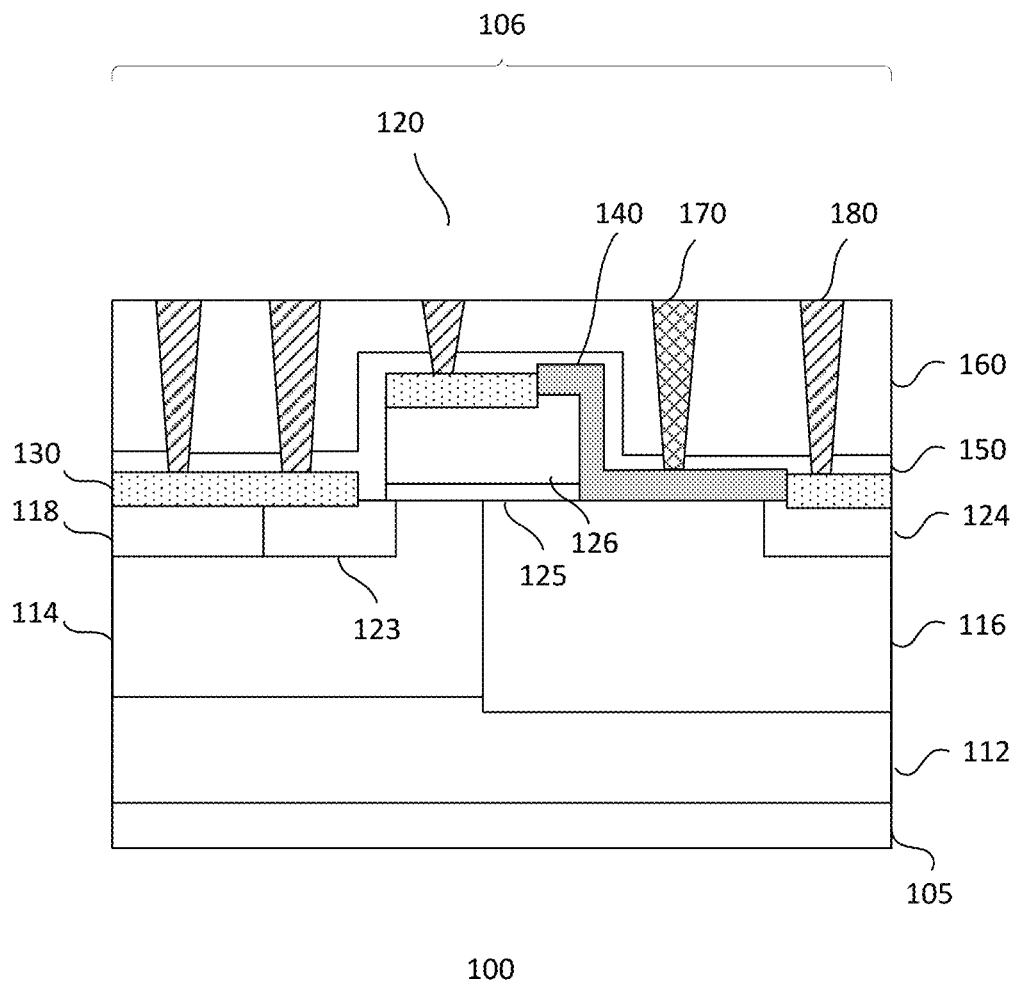
FIG. 1 shows a simplified cross-sectional view of an embodiment of a device.

FIG. 1 shows a cross-sectional view of a portion of a device 100. The device, for example, is an IC. Other types of devices may also be useful. As shown, the device 100 includes a substrate 105. The substrate 105, for example, is a silicon substrate. Other types of substrates, such as silicon germanium, germanium, gallium arsenide, or crystal-on-insulator (COI) such as silicon-on-insulator (SOI), are also useful. The substrate 105 may be a doped substrate. For example, the substrate 105 can be lightly doped with p-type dopants. Providing a substrate with other types of dopants or dopant concentrations as well as an undoped substrate, may also be useful.

The device 100 may include doped regions having different dopant concentrations. For example, the device 100 may include heavily doped ($x^+$), intermediately doped ($x$) and lightly doped ($x$) regions, where x is the polarity type which can be p or n. A lightly doped region may have a dopant concentration of about 1e14-2e16 cm$^{-3}$, an intermediately doped region may have a dopant concentration of about 1e16-1e18 cm$^{-3}$, and a heavily doped region may have a dopant concentration of about 1e18-1e21 cm$^{-3}$. Providing other dopant concentrations for the different doped regions may also be useful. P-type dopants may include boron (B), aluminum (Al), indium (In) or a combination thereof, while n-type dopants may include phosphorous (P), arsenic (As), antimony (Sb) or a combination thereof.

The substrate 105 includes a device region 106. The device region 106, for example, is an intermediate (medium) voltage (MV) device region for a medium voltage device, such as an extended drain transistor. In one embodiment, the device region 106 includes an extended drain MOS (EDMOS) transistor 120. Providing other types of devices in the device region may also be useful. The substrate 105 may also include regions for other types of circuitry, depending on the type of device or IC. For example, the substrate may also include regions for high voltage (HV) and low voltage (LV) devices as well as an array region for memory devices.

Isolation regions may be provided for isolating or separating different regions of the substrate. In one embodiment, the device region 106 is isolated from other regions by a device isolation region (not shown). For example, the device isolation region surrounds the device region 106. The isolation region, for example, is a shallow trench isolation (STI) region. An STI region includes an isolation trench filled with isolation or dielectric materials. Other types of isolation regions may also be employed. For example, the isolation region may be a deep trench isolation (DTI) region. The STI regions, for example, extend to a depth of about 2000-5000 Å. In the case of DTI regions, the depth may be about 1-10 μm. Providing isolation regions which extend to other depths may also be useful.

In one embodiment, a first device doped well 112 is disposed in the substrate in the device region 106. The first device doped well 112, as shown, encompasses the complete device region. For example, the first device doped well 112 is disposed in the substrate from about an inner edge of the isolation region. Providing the first device doped well which extends from the bottom of the isolation region between inner and outer edges of the isolation region is also useful. In one embodiment, the first device doped well 112 is a deep device doped well. The deep device doped well 112, for example, extends to a depth of about 2-15 μm with respect to the top substrate surface. Providing the deep device doped well of different depth may also be useful.

In one embodiment, the deep device doped well 112 is a lightly doped well. For example, the dopant concentration of the deep device doped well may be about 1e14-2e16 cm$^{-3}$. Providing a deep device doped well having other dopant concentrations may also be useful. In one embodiment, the deep device doped well 112 is a first polarity type deep well. Providing a second polarity deep well may also be useful. For example, the first polarity type is n-type and the second polarity type is p-type. The deep device doped well may serve as a common deep device doped well for devices formed on the same substrate. For example, the deep device doped well serves as a common deep well for both first and second polarity type devices.

The transistor 120, in one embodiment, is an intermediate (medium) voltage (MV) transistor. The transistor 120 includes various components. For example, the transistor 120 includes first and second doped or source/drain (S/D) regions 123 and 124 and a gate. In one embodiment, the first doped region 123 is a source region and the second doped region 124 is a drain region of the transistor 120.

The gate is disposed on the surface of the substrate 105. The gate, in one embodiment, includes a gate electrode 126 over a gate dielectric 125. The gate dielectric 125, for example, may be silicon oxide while the gate electrode 126 may be polysilicon. The thicknesses of the gate dielectric and gate electrode are determined by the device requirements, for example, breakdown voltage, operating voltage and other operating parameters. In some embodiments, the gate electrode 126 may be a doped electrode. For example, the gate electrode 126 may be polysilicon doped with first polarity type dopants. Other types of gate dielectrics and gate electrodes as well as thicknesses may also be useful. For example, the gate dielectric 125 may be a high k gate dielectric and/or the gate electrode may be a metal gate electrode. Other configurations of gate layers of the gate may also be useful. The gate, for example, traverses the device region 106 along the z direction or channel width direction. The width of the gate along a channel length direction of the transistor 120 may be, for example, about 0.6 μm. Providing a gate having other widths may also be useful. The gate width, for example, may depend on the operating voltage and technology node. As shown, the channel length direction is in the x direction. The x and z directions, for example, are orthogonal directions.

The source and drain regions are heavily doped regions in the substrate 105 adjacent to the gate. For example, the first doped region or source 123 is disposed on the first side of the gate and the second doped region or drain 124 is disposed on the second side of the gate. The doped regions, in one embodiment, are heavily doped with first polarity type dopants for a first polarity type transistor. For example, the doped regions are heavily doped n-type (n$^+$) regions for a n-type transistor. Providing heavily doped p-type (p$^+$) regions may also be useful for a p-type transistor. The heavily doped regions, for example, have a dopant concentration of about 5e19-5e20 cm$^{-3}$. Other dopant concentrations for the doped regions may also be useful. The source and drain regions, for example, may be formed in the same process. In this case, the source and drain regions may have similar characteristics. The depth of the doped regions may be about 0.1-0.3 μm. Providing doped regions having other depths may also be useful. Additionally, it is not necessary that the first and second doped regions have the same depth.

In one embodiment, the source region 123 is adjacent to the first side and may underlap the gate. The source region 123 includes a lightly doped portion and a heavily doped deeper portion. The lightly doped portion underlaps the gate. The underlap portion should be sufficient for the source region 123 to be in communication with the channel under the gate. An underlap portion which underlaps the gate by other amounts may also be useful. In one embodiment, the underlap portion of the source region is a lightly doped source (LDS) region.

The source region 123, in one embodiment, is disposed in a second device doped well 114. The second device doped well 114 is disposed within the first device doped well 112 in the substrate 105. In one embodiment, the second device doped well 114 is intermediately doped with second polarity type dopants for a first polarity type device. For example, the second device doped well 114 has a dopant concentration of about 1e16-1e18 cm$^{-3}$. Other dopant concentrations may also be useful. In the case of a n-type device, the second device doped well is a p well. The second device doped well 114 serves as a body well for the transistor 120. The depth of the body well 114 may be about 0.5-3 μm depending on the design voltage of the device. Other depths may also be useful.

Sidewall spacers (not shown) may be provided on the sidewalls of the gate. The sidewall spacers, for example, are dielectric spacers. The dielectric spacers, for example, may be silicon oxide spacers. Other types of dielectric material, such as silicon nitride, may also be used. In some applications, the dielectric spacer may be formed from multiple dielectric layers.

In one embodiment, a body bias contact region 118 is provided in the body well 114 to bias the body of the transistor 120. The body bias contact region 118, in one embodiment, is heavily doped with second polarity type dopants. For example, the body bias contact region 118 has the same polarity type dopants as the body well 114. The dopant concentration of the body bias contact region 118, for example, is about $5e19\text{-}5e20\ cm^{-3}$. Other dopant concentrations may also be useful. The body bias contact region 118 is disposed away from the gate. For example, the source region 123 is disposed between the body bias contact region 118 and the gate. This separates the body bias contact region 118 from the gate. The body bias contact region 118 and source region 123 are, for example, butt contact region. In one embodiment, the body is biased with the same voltage as provided at the source region. In other embodiments, the body bias contact region 118 may also be separated from the source region 123 by the STI and be biased with different voltage from the source region 123.

The drain region 124, in one embodiment, is disposed in a third device doped well 116. A third device doped well 116 is disposed in the substrate 105. The third device doped well 116 serves as a drift well. The drift well 116, in one embodiment, is disposed within the first device doped well 112 in the device region 106. For example, the drift well 116 is disposed between the gate and the drain region 124, under-lapping a portion of the gate. In one embodiment, the depth or bottom of the drift well 116 is below the drain region. In one embodiment, the depth or bottom of the drift well 116 is below the device isolation region (not shown). The depth of the drift well 116 may be about 0.5-3 nm depending on the design voltage of the device. The depth of the drift well 116, as shown, is deeper than the body well 114. Other depths may also be useful. For example, the drift well 116 may be about the same depth as the body well 114 or shallower than the body well 114. Other configurations of the body well and drift well may also be useful.

In one embodiment, the drift well 116 is contiguous and encompasses the drain region 124 and at least overlaps a portion of the active region underneath the gate. The distance from the drain to the channel under the gate is the drift distance of the transistor 120.

The drift well 116 includes first polarity type dopants. In one embodiment, the drift well is an intermediately doped well with first polarity type dopants for a first polarity type device. For example, the drift well is a n well for a n-type device. The dopant concentration of the drift well may be about $1e16\text{-}1e18\ cm^{-3}$. Other dopant concentration for the drift well may also be useful. For example, the dopant concentration may depend on the maximum or breakdown voltage requirement of the device. The drift well has a dopant concentration between the first device doped well 112 and the drain region 124.

In one embodiment, the drain region 124 is distant from the second side of the gate. As shown, the drain region 124 is displaced from the gate by an insulation layer 140. The insulation layer 140, for example, is a salicide (self-aligned silicide) block (SAB) layer. In one embodiment, the salicide block layer 140 is a conformal layer. The salicide block layer 140 is disposed on a portion of the gate on the second side, the top surface of the drift well 116 and a portion of the drain region 124. As shown, the salicide block layer 140 overlaps the sidewall of the gate on the second side, a portion of the top surface of the gate adjacent to the sidewall, the top surface of the drift well 116 and a portion of the drain region 124 adjoining the drift well.

The salicide block 140, for example, is formed from a material of which silicidation does not occur. In one embodiment, the salicide block 140 is formed of a dielectric material. The dielectric material partially covers the gate and drift well, preventing salicidation of the substrate between the gate and drain region. For example, the salicide block prevents salicide formation thereon and thus prevents current localization and provides a ballast resistance to increase the current uniformity at the drain-side. This, for example, provides a high resistance drift region to sustain high voltage applied to the drain. The dielectric material, for example, may be a stoichiometric $SiO_2$, silicon-rich oxide or a combination thereof. Any other dielectric materials, such as those having a good SiO/SiN etch selectivity may also be useful. The salicide block 140 may be about 400-700 Å thick. Other thicknesses of salicide block may also be useful. The thickness of the salicide block may depend on the breakdown voltage requirements and the process feasibility.

Metal silicide contacts 130 are be provided on terminals or contact regions of the transistor 120 and body bias contact region 118. For example, metal silicide contacts 130 are provided on the top surface of the gate electrode 126 not covered by the salicide block layer, source 123 and drain 124. The silicide contacts 130, for example, may be nickel-based silicide contacts. Other types of metal silicide contacts may also be useful. For example, the metal silicide contact may be cobalt silicide (CoSi). The silicide contacts may be about 300 Å thick. Other thickness of silicide contacts may also be useful. The silicide contacts may be employed to reduce contact resistance and facilitate contact to the back-end-of-line metal interconnects.

An etch stop layer 150 is disposed over the substrate 105, lining the salicide block layer 140 and metal silicide contacts 130 provided on the gate electrode 126, source region 123, drain region 124 and body bias contact region 118. The etch stop layer 150, in one embodiment, is a conformal layer. The etch stop layer 150 is formed of a dielectric layer. In one embodiment, the etch stop layer 150 is a silicon nitride layer. Other types of dielectric layers may also be useful. For example, the etch stop layer 150 may be a silicon oxynitride layer. In one embodiment, the etch stop layer may be a multi-layered stack. The etch stop layer includes materials which have a different etch selectivity than the materials of the pre-metal dielectric (PMD) layer. The thickness of the etch stop layer 150, for example, is about 200-600 Å. Other thicknesses may also be useful. The thickness of the etch stop layer may depend on the breakdown voltage requirements and the process feasibility.

A dielectric layer 160 is disposed on the substrate, covering the transistor. The dielectric layer 160, in one embodiment, serves as a pre-metal dielectric (PMD) layer. The dielectric layer 160, for example, is a silicon oxide layer. In one embodiment, the dielectric layer 160 is a high aspect ratio process (HARP) dielectric material. Other types of dielectric materials are also useful. For example, the dielectric layer can be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG). The dielectric layer 160 should be capable of selectively etched or patterned with respect to the etch stop layer 150.

The etch stop layer 150 and PMD layer 160 form an overlayer on the substrate. The overlayer (e.g., the etch stop layer 150 and PMD layer 160) include via holes or contact plug openings for accommodating contact plugs 180 which are electrically connected to contact regions of the transistor 120. For example, contacts plugs 180 are provided in the via holes which pass through the etch stop layer 150 and PMD layer 160 to the metal silicide contacts 130 disposed on the gate electrode, source region 123, drain region 124 and body bias contact region 118. The contact plugs 180, for example, may be tungsten contact plugs. Other types of conductive contact plugs may also be useful.

Referring to FIG. 1, the device 100 includes a field plate. In one embodiment, the field plate is provided in the form of a field plate contact 170. The field plate contact 170, in one embodiment, may be an elongated field plate contact which traverses the transistor along the channel width direction. In such case, the etch stop layer 150 and PMD layer 160 include an elongated trench which traverses along the channel width direction for accommodating the field plate contact 170. For example, the field plate contact 170 is provided in the elongated trench which passes through the etch stop layer 150 and PMD layer 160 to the salicide block layer 140. In another embodiment, the field plate contact may be provided in the form of multiple field plate contact plugs 170 arranged in series along the channel width direction. In such case, the etch stop layer 150 and PMD layer 160 include a plurality of via holes with suitable size for accommodating the field plate contact plugs. The via holes for accommodating the field plate contact plugs are similar to the via holes for accommodating the contact plugs 180. The field plate contact plugs 170, for example, are provided in the via holes which passes through the etch stop layer 150 and PMD layer 160 to the salicide block layer 140. The field plate in the form of field plate contact plugs, in one embodiment, includes the same conductive material as the contact plugs 180. The field plate contact 170, may be a tungsten field plate contact. Other types of conductive materials may also be useful. The field plate contact 170 disposed over and coupled with the salicide block layer 140 may be referred to as a stepped field plate.

FIGS. 2a-2b show simplified plan views of various embodiments of a device 200. The device 200, as shown, includes a transistor that is similar to that described in FIG. 1. Thus, common features or features having the same reference numerals may not be described or described in detail. For illustration purpose, the etch stop layer 150, PMD layer 160 and metal silicide contacts 130 are omitted. In one embodiment, the field plate is in the form of an elongated field plate contact 170 which is a long strip having a narrow width that traverses the transistor along the z or channel width direction, as shown in FIG. 2a. The z direction is the direction perpendicular to the channel length of the transistor. The width of the field plate contact, for example, is about 10-20 µm. Other widths may also be useful as long as it is sufficiently narrow to ensure that the trench can be fully filled by the conductive material. The contact plugs 180 are provided for each of the contacts/terminals of the transistors. As shown, the contact plugs for each of the contacts/terminals are provided as a series of contact plugs arranged in a column and the column traverses the transistor in the z direction. The contact plugs, in one embodiment, are of the same size. The width maybe be about the same size as the length. The length of each of the contact plug, for example, may be shorter than the length of the field plate along the channel width direction. The width of each of the contact plug, for example, may be about the size of the width of the field plate contact along the channel length direction. Such configuration ensures that the contact plug openings which pass through the etch stop layer 150 and PMD layer 160 are fully filled by the conductive material.

In another embodiment, the field plate is provided in the form of a series of field plate contact plugs 170 arranged in a column in the z direction which resembles that of the contact plugs 180 as shown in FIG. 2b. The space between the adjacent field plate contact plugs in the column may be determined by the minimum printed contact (CT) space rule. As shown, the field plate contact plugs 170, for example, may have about the same size as the contact plugs 180. Providing field plate contact plugs having different size than that of the contact plugs may also be useful. In addition, the number of contact plugs and field plate contact plugs, as shown, are for illustration purposes. It is understood that the device may include any suitable number of contact plugs and field plate contact plugs, depending on device requirements.

An inter-metal dielectric (IMD) layer (not shown) may be provided over the PMD layer. The IMD layer, for example, may be silicon oxide. Other types of IMD dielectric materials may also be useful. The IMD layer may include conductive lines or metal lines disposed in the IMD layer which interconnect to the contact plugs. Other configurations of IMD and PMD layers may also be useful. In one embodiment, the field plate contact 170 may be connected to the gate or source region 123 through a common metal line (not shown) disposed in the IMD layer which also connects with contact plugs coupled to the gate or source region. Such configuration ties the potential of the field plate contact to the gate or source, eliminating the unknown floated potential.

Figure 3A:
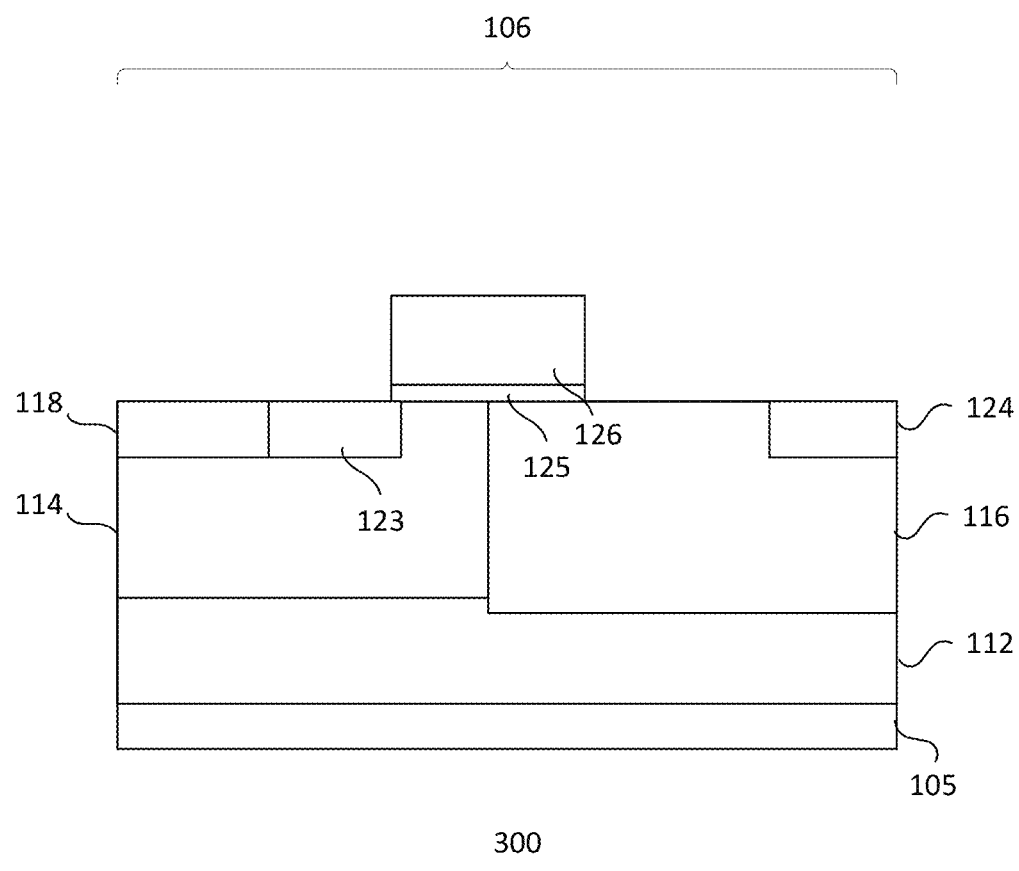
FIGS. 3a-3h show cross-sectional views of an embodiment of a process for forming a device.

FIGS. 3a-3h show cross-sectional views of an embodiment of a process 300 for forming a device. The device, for example, is similar to that described in FIG. 1. As such, common elements may not be described or described in detail. Referring to FIG. 3a, a substrate 105 is provided. The substrate, in one embodiment, is a silicon substrate. The substrate may be a doped substrate, such as a p⁻ substrate. Other types of substrates, such as a germanium-based, gallium arsenide, sapphire, or COI such as SOI, may also be useful. The substrate may be doped with other types of dopants or dopant concentrations, including undoped substrate.

As shown, a device region 106 is defined on the substrate. Although one device region is shown, it is however understood that the substrate may include various types of regions (not shown). For example, the substrate may include other device regions for other types of devices. The IC may include logic regions in which logic devices are formed. Depending on the type of IC formed, the logic regions, for example, may include regions for different voltage devices. For example, the logic regions may include regions for high voltage (HV) devices, medium or intermediate voltage (MV) devices and low voltage (LV) devices. Other configurations of logic regions may also be useful. Additionally, other types of device regions may also be provided.

In one embodiment, the device region 106 is a MV region. The device region 106, for example, serves as a device region for a EDMOS transistor. Providing a device region for other types of devices may also be useful. The device region is separated from other regions by a device isolation region (not shown). The device isolation region surrounds the device region.

The device isolation region, for example, includes STI region. Various processes can be employed to form the STI regions. For example, the substrate can be etched using etch and mask techniques to form isolation trenches which are then filled with dielectric materials such as silicon oxide. Chemical mechanical polishing (CMP) can be performed to remove excess oxide and provide a planar substrate top surface. Other processes or materials can also be used to form the STIs. The depth of the STIs may be, for example, about 3000-4000 Å. Other depths for the STIs may also be useful. In other embodiments, the device isolation region may be other types of isolation regions.

A first doped well 112 is formed in the device region. The first doped well 112 serves as a deep well for the device. The depth of the deep well 112, for example, may be about 2-15 µm. Providing a deep well of other depths may also be useful. The depth of the deep well, for example, may depend on the device operation voltage. The deep well 112 includes first polarity type dopants. Providing the deep well with second polarity type dopants may also be useful. The deep well 112 may serve as a common deep well for devices formed on the same substrate. For example, the deep well 112 may serve as a common deep well for both first and second polarity type devices which are formed on the same substrate. As an example, a n-type deep well may be provided for n-type and p-type devices on the same substrate. In one embodiment, the deep well 112 may be lightly or intermediately doped with first polarity type dopants. In one embodiment, the deep well is a lightly doped device well. For example, the dopant concentration of the device well is about 1e14-2e16 $cm^{-3}$. Other dopant concentration for the deep well may also be useful.

In some embodiments, a second doped well 114 is formed in the deep well 112. The second device well 114 serves as a body well for the transistor. The body well 114, for example, includes second polarity type dopants for a first polarity type transistor. In the case of a second polarity type transistor, the body well includes first polarity type dopants. For example, the body well includes p-type dopants for a n-type transistor or n-type dopants for a p-type transistor. In one embodiment, the body well 114 is an intermediately doped device well. For example, the dopant concentration of the body well 114 is about 1e16-1e18 $cm^{-3}$. The depth of the body well 114, for example, is about 0.5-3 µm. Other suitable depths and dopant concentrations for the body well 114 may also be useful. The depth of the body well, for example, may depend on the device operation voltage.

A third doped well 116 is formed in the deep well 112. The third doped well serves as a drift well for the device. The depth of the drift well, for example, may be about 0.5-3 µm. Providing a drift well of other depths may also be useful. The depth of the drift well, for example, may depend on the device operation voltage. The drift well includes first polarity type dopants for a first polarity type device. For example, a n-type drift well is provided for a n-type device. The n-type drift well, for example, may include phosphorus dopants. Forming a p-type drift well for a p-type device may also be useful. In one embodiment, the drift well 116 may be lightly or intermediately doped with first polarity type dopants. For example, the dopant concentration of the drift well is about 1e14-2e16 $cm^{-3}$. Other dopant concentration for the drift well may also be useful. The depth of the drift well 116, as shown, is deeper than the body well 114. Other depths may also be useful. For example, the drift well 116 may be about the same depth as the body well 114 or shallower than the body well 114. Other configurations of the body well and drift well may also be useful.

To form a doped well, an implant mask which exposes the device region is used. The implant mask, for example, includes a photoresist patterned by a lithographic mask. Dopants are implanted into the substrate using the implant mask. The dopants are implanted with the appropriate dose and power. Separate implant processes with respective implant masks are used to form doped wells of different polarity types. In some embodiments, a doped well may be formed by, for example, performing multiple implants at different energies. Other configurations of implant processes may also be employed to form the doped wells.

An anneal is performed. In one embodiment, the anneal is performed after the doped wells are formed. The anneal activates the dopants. In other embodiments, separate anneals may be performed for the doped wells. For example, an anneal may be performed after forming a doped well.

As shown in FIG. 3a, a gate is formed on the substrate. In one embodiment, the gate includes a gate dielectric 125 on the substrate and a gate electrode 126 thereon. The gate dielectric 125, for example, is silicon oxide. The thickness of the gate dielectric 125 is defined by the gate application voltage and other operating requirements. The gate dielectric 125 may be formed by thermal oxidation. For example, the gate dielectric 125 is formed by wet oxidation followed by annealing the substrate in an oxidizing ambient with suitable temperature.

As for the gate electrode 126, it may be polysilicon. The thickness of the gate electrode 126 may be about 500-2000 Å. Other thickness may also be useful. The gate electrode 126 may be formed by, for example, CVD. Other techniques for forming the gate electrode 126 may also be useful. The gate electrode 126 can be formed as an amorphous or non-amorphous layer. In one embodiment, the gate electrode 126 is polysilicon doped with first type dopants. The concentration of dopants in the gate electrode 126 may be about 1e20 $cm^{-3}$. Various techniques may be employed to dope the gate electrode 126, for example, in-situ doping or ion implantation.

Other types of gate dielectric and gate electrode materials or thicknesses may also be useful. For example, the gate dielectric material may be a high k dielectric material while the gate electrode may be a metal gate electrode material. Other configuration of gate layers may also be useful. For example, the gate dielectric and/or gate electrode may have multiple layers. The layers can be formed by various techniques, such as thermal oxidation, CVD and sputtering.

The gate having a gate dielectric and gate electrode may be formed by mask and etch techniques. For example, a gate dielectric layer is formed on the substrate and a gate electrode layer is formed thereon. Subsequently, a patterned mask layer serves as an etch mask is formed on the gate layers. The etch transfers the pattern of the mask to the gate layers. The etch removes the gate layers unprotected by the mask, exposing the substrate. The etch, for example, may be an anisotropic etch, such as reactive ion etch (RIE). Other types of etch processes may also be useful. In one embodiment, an RIE is employed to pattern the gate layers to form a gate having the gate electrode 126 and gate dielectric 125.

A lightly doped portion is formed in the body well adjacent a first side of the gate. The lightly doped portion underlaps the gate. The underlap portion is a lightly doped source (LDS) region. The underlap portion should be sufficient for the source region 123 to be in communication with the channel under the gate. After forming the lightly doped portion of the source region 123, a dielectric spacer layer (not shown) is formed on the substrate. The dielectric spacer layer, for example, may be a silicon oxide layer. Other types of dielectric layer or layers may also be useful. The dielectric layer may be formed using, for example, CVD. After forming the dielectric layer, an anisotropic etch, such as RIE, is performed. The etch removes horizontal portions of the dielectric layer, leaving sidewall spacers (not shown) on the sidewalls of the gates.

A source region 123 is formed in the body well 114 adjacent a first side of the gate and a drain region 124 is formed in the drift well 116 adjacent a second side of the gate. As shown, the drain region 124 is distant from the second side of the gate. The source and drain regions are heavily doped regions having first polarity type dopants for a first polarity type transistor. Forming the heavily doped regions include implanting first polarity type dopants into the substrate. The implant dose may be about 1e15 cm$^2$ and the implant energy may be 10-100 KeV. Other implant parameters may also be useful. In one embodiment, the lightly doped source (LDS) portion and a heavily doped deeper portion form the source region 123.

A body bias contact region 118 is formed in the body well 114. As shown, the body bias contact region 118 and source region 123 are contiguous. The body bias contact region 118, in one embodiment, is heavily doped with second polarity type dopants. For example, the body bias contact region 118 has the same polarity type dopants as the body well 114. The dopant concentration of the body bias contact region 118, for example, is about 5e19-5e20 cm$^{-3}$. Other dopant concentrations may also be useful. Forming the heavily doped regions includes implanting second polarity type dopants into the substrate. The implant dose may be about 1e15 cm$^{-2}$ and the implant energy may be about 10-100 KeV. Other implant parameters may also be useful.

Figure 3B:
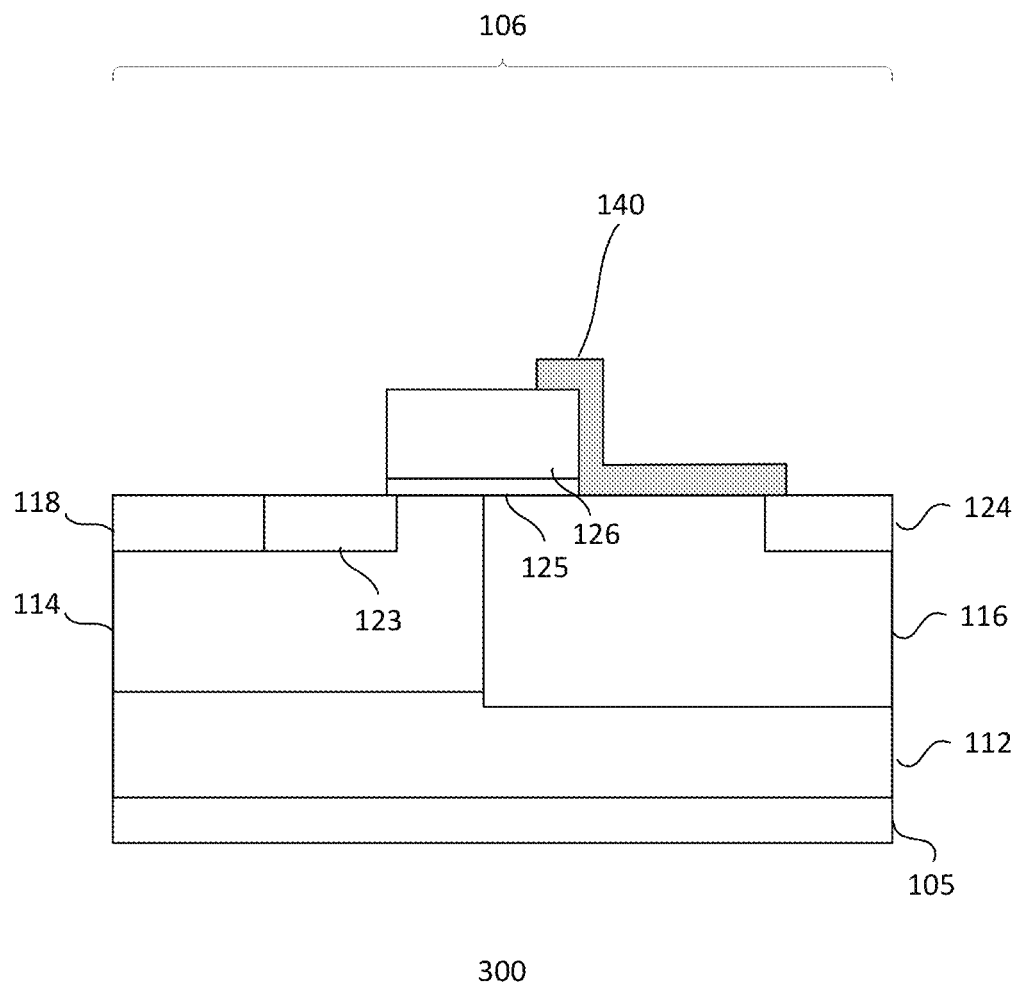

An insulation layer 140 is formed on the substrate. The insulation layer 140, for example, is a (self-aligned silicide) block (SAB) layer. In one embodiment, the salicide block layer is a conformal layer. The salicide block layer 140, for example, is silicon oxide. The thickness of the salicide block layer may be about 400-700 Å. The salicide block layer may be formed by thermal oxidation. For example, the salicide block layer is formed by wet oxidation followed by annealing the substrate in an oxidizing ambient. The temperature of the wet oxidation can be, for example, about 600-900° C. The annealing can be, for example, performed at a temperature of about 600-1000° C. Other suitable temperature may also be useful. The salicide block layer is patterned by, for example, mask and etch techniques. A patterned photoresist mask may be provided over the salicide block layer. An anisotropic etch, such as a reactive ion etch (RIE) is used to pattern the salicide block layer to form a patterned salicide block layer 140 using the patterned photoresist mask. As shown in FIG. 3b, the patterned salicide block layer 140 overlaps the sidewall of the gate on the second side, a portion of the top surface of the gate adjacent to the sidewall, the top surface of the drift well 116 and a portion of the drain region 124 adjoining the drift well.

Figure 3C:
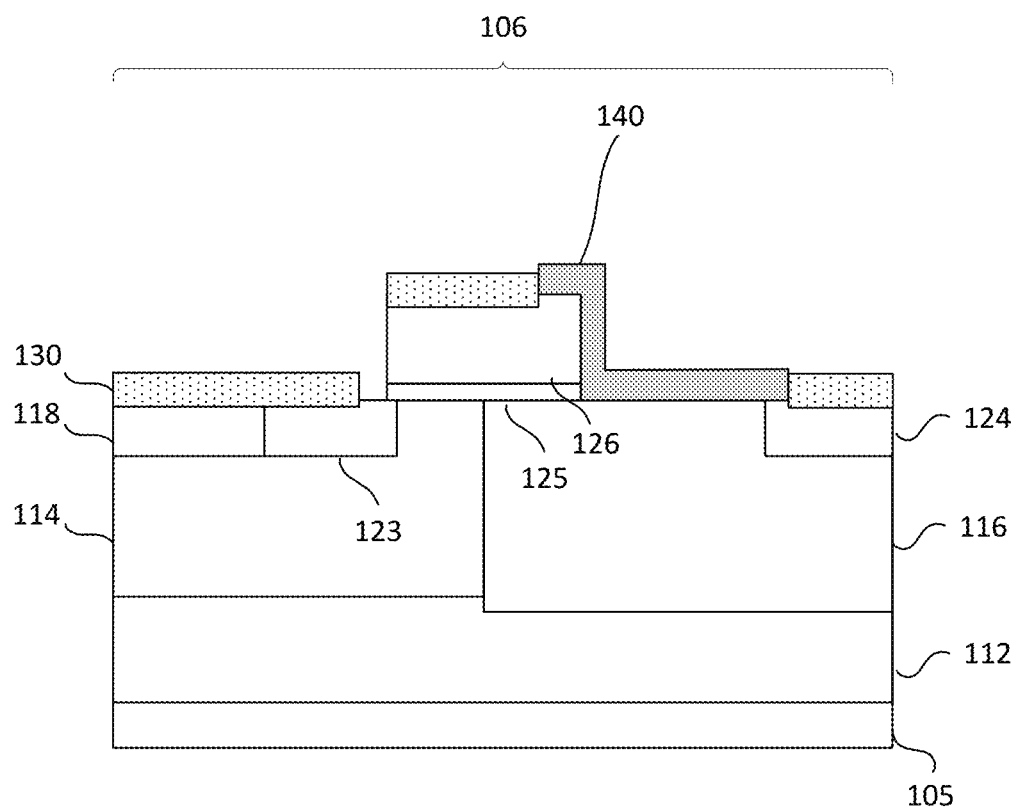

Referring to FIG. 3c, silicide contacts 130 are formed on contact regions of the transistor. For example, the silicide contacts are formed on the gate, source and drain regions of the transistor. The silicide contacts are to facilitate low resistance contacts between the active substrate and the BEOL metal lines. In one embodiment, the thickness of the silicide contacts is about 50-300 Å. Providing other thicknesses may also be useful.

To form the silicide contacts, a metal layer is deposited on the surface of the substrate. The metal layer, for example, may be cobalt or an alloy thereof. Other types of metallic layers, such as nickel, or alloys thereof, may also be used. The metal layer can be formed by Physical Vapor Deposition (PVD). Other types of metal elements that can be formed by other types of processes can also be useful.

A first anneal may be performed. The first anneal diffuses the metal dopants into the active substrate, forming a silicide layer. The first anneal, for example, is performed at a temperature of about 500° C. for about 30 seconds. Excess metal not used in the silicidation of the active surface is removed by, for example, a wet removal process. For example, unreacted metal material is removed selective to the silicide contacts. A second anneal may be performed to enhance the material properties of the silicide layer, for example, lower resistivity. The first and second annealing processes may be a rapid thermal anneal (RTA). Other annealing parameters or techniques may also be useful to form the silicide contacts.

Figure 3D:
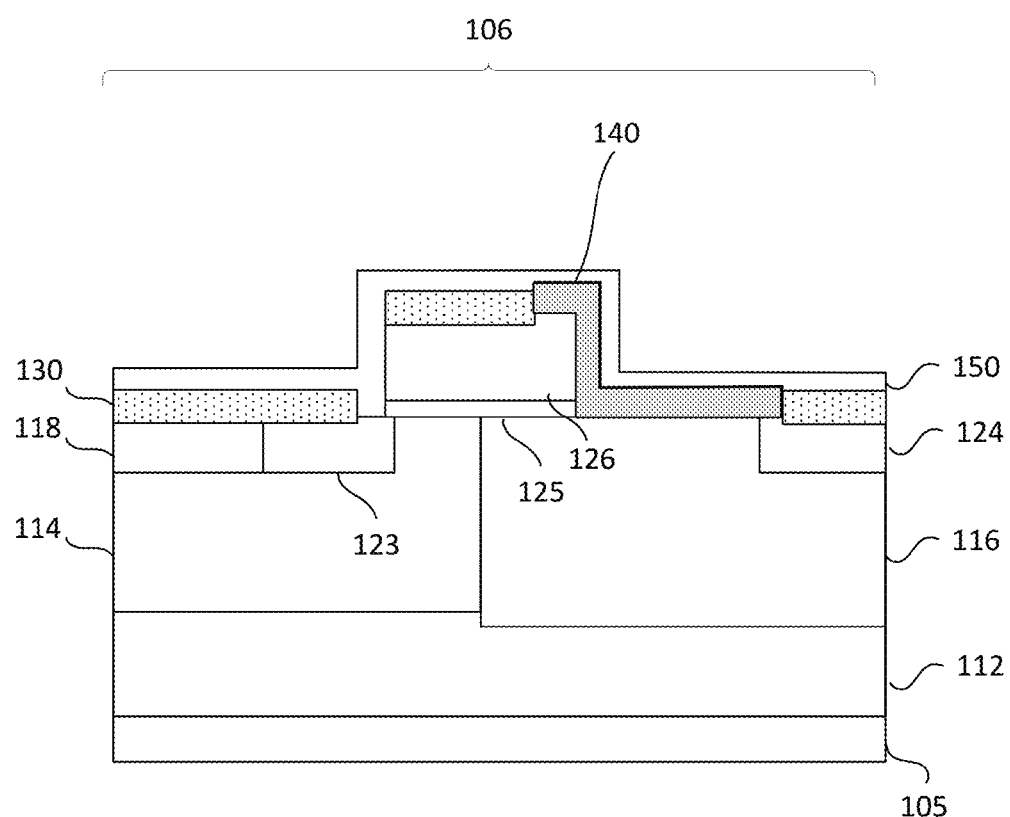

Referring to FIG. 3d, an etch stop layer 150 is formed over the substrate 105, lining the salicide block layer 140 and metal silicide contacts 130 provided on the gate electrode 126, source region 123, drain region 124 and body bias contact region 118. The etch stop layer 150, in one embodiment, is a conformal layer. The thickness of the etch stop layer 150, for example, is about 200-600 Å. Other thicknesses may also be useful. The etch stop layer 150 is formed of a dielectric layer. In one embodiment, the etch stop layer 150 is a silicon nitride layer. Other types of dielectric layers may also be useful. For example, the etch stop layer 150 may be a silicon oxynitride layer. In one embodiment, the etch stop layer may be a multi-layered stack. The etch stop layer includes materials which have a different etch selectivity than the materials of the pre-metal dielectric (PMD) layer. Various techniques, such as CVD, may be employed to form the etch stop layer 150.

Figure 3E:
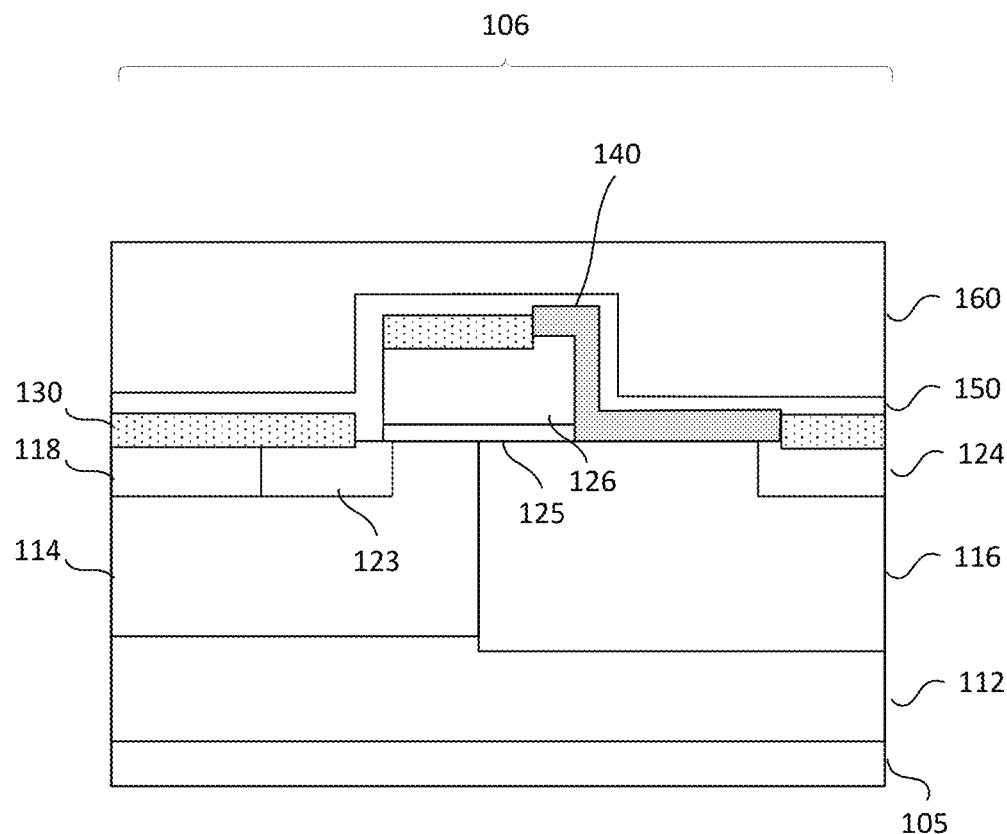

As shown in FIG. 3e, a dielectric layer 160 is formed on the substrate, covering the transistor. The dielectric layer 160, in one embodiment, serves as a pre-metal dielectric (PMD) layer. The dielectric layer 160, for example, is a silicon oxide layer. In one embodiment, the dielectric layer is a high aspect ratio process (HARP) dielectric material. Other types of dielectric materials are also useful. For example, the dielectric layer 160 can be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG). The dielectric layer 160 should be capable of selectively etched or patterned with respect to the etch stop layer 150. The dielectric layer 160 may be formed by, for example, CVD. Other techniques may also be employed to form the dielectric layer.

Figure 3F:
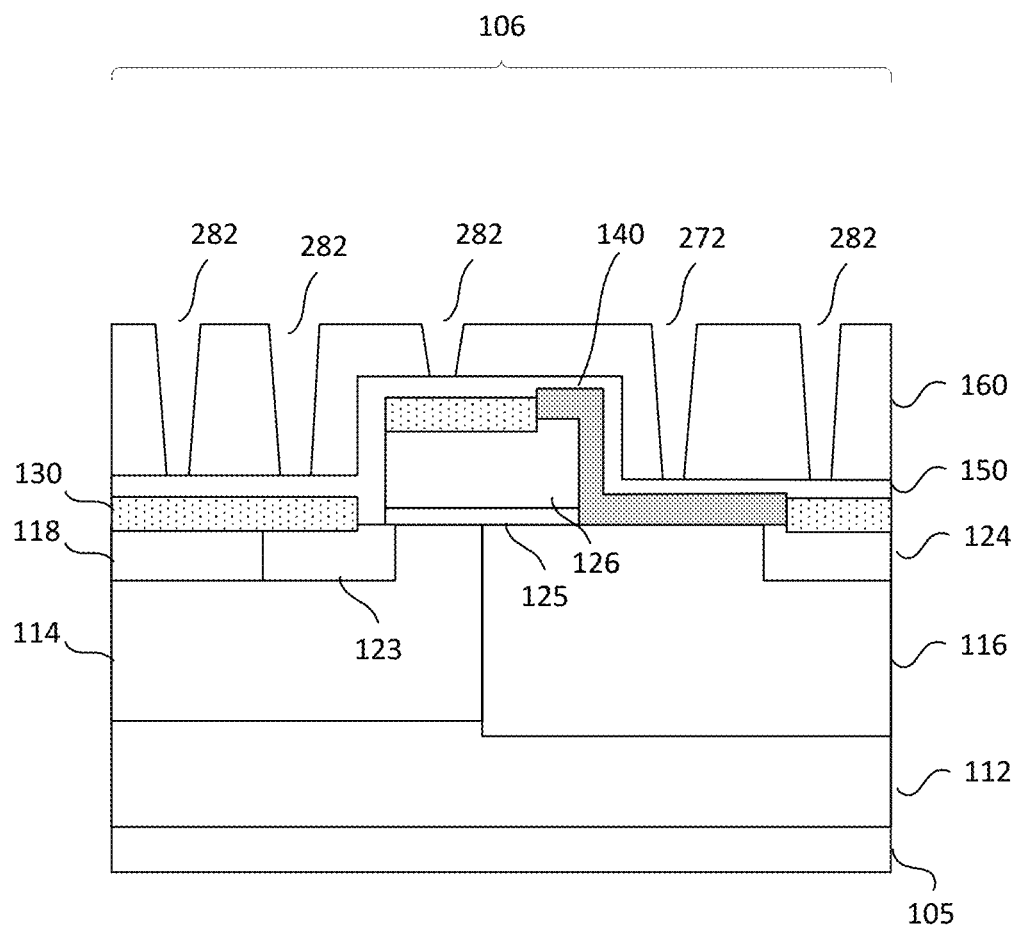

Referring to FIG. 3f, portions of the dielectric layer 160 are removed by, for example, mask and etch techniques. A patterned photoresist mask may be provided over the dielectric layer 160. An anisotropic etch, such as a reactive ion etch (RIE) is used to pattern the dielectric layer 160 to form first and second type openings 272 and 282 using the patterned photoresist mask. Other types of etch processes may also be useful. After patterning the dielectric layer 160, the patterned mask is removed. In other embodiments, to assist the subsequent formation of deep openings as will be described later, the patterned mask may not be removed at this stage.

Figure 3G:
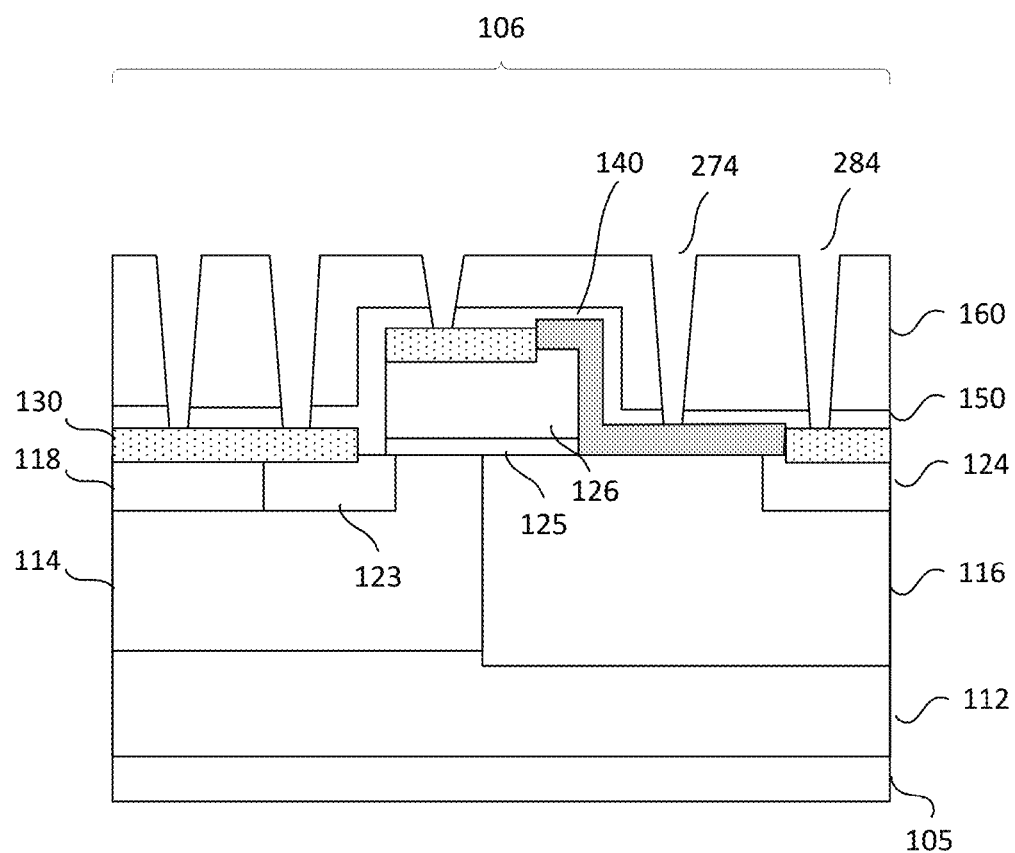

The opening 272, for example, accommodates a field plate contact while the openings 282 accommodates contact plugs which are coupled to contact regions of the transistor. In one embodiment, the opening 272 may be configured as an elongated trench with narrow width which traverses along the z direction. In another embodiment, the opening 272 may be configured as via holes similar or the same as the via holes for accommodating the contact plugs. In one embodiment, the etch process stops at the underlying etch stop layer 150 as shown in FIG. 3f due to the etch selectivity. The openings 272 and 282 expose the underlying etch stop layer 150. The exposed portions of the etch stop layer by the openings are etched to form deep openings 274 and 284, as shown in FIG. 3g. In one embodiment, the etch, for example, is assisted by the dielectric layer 160. The dielectric layer 160, which has a different etch selectivity than that of the etch stop layer 150, serves as an etch mask. In other embodiments, where the patterned mask for forming the openings 272 and 282 is intact, the etch is assisted by both the patterned mask and the dielectric layer. The patterned mask is subsequently removed after forming the deep openings 274 and 284. The first deep opening 274 exposes the salicide block layer 140, whereas the second deep openings 284 expose the silicide contacts 130.

Figure 3H:
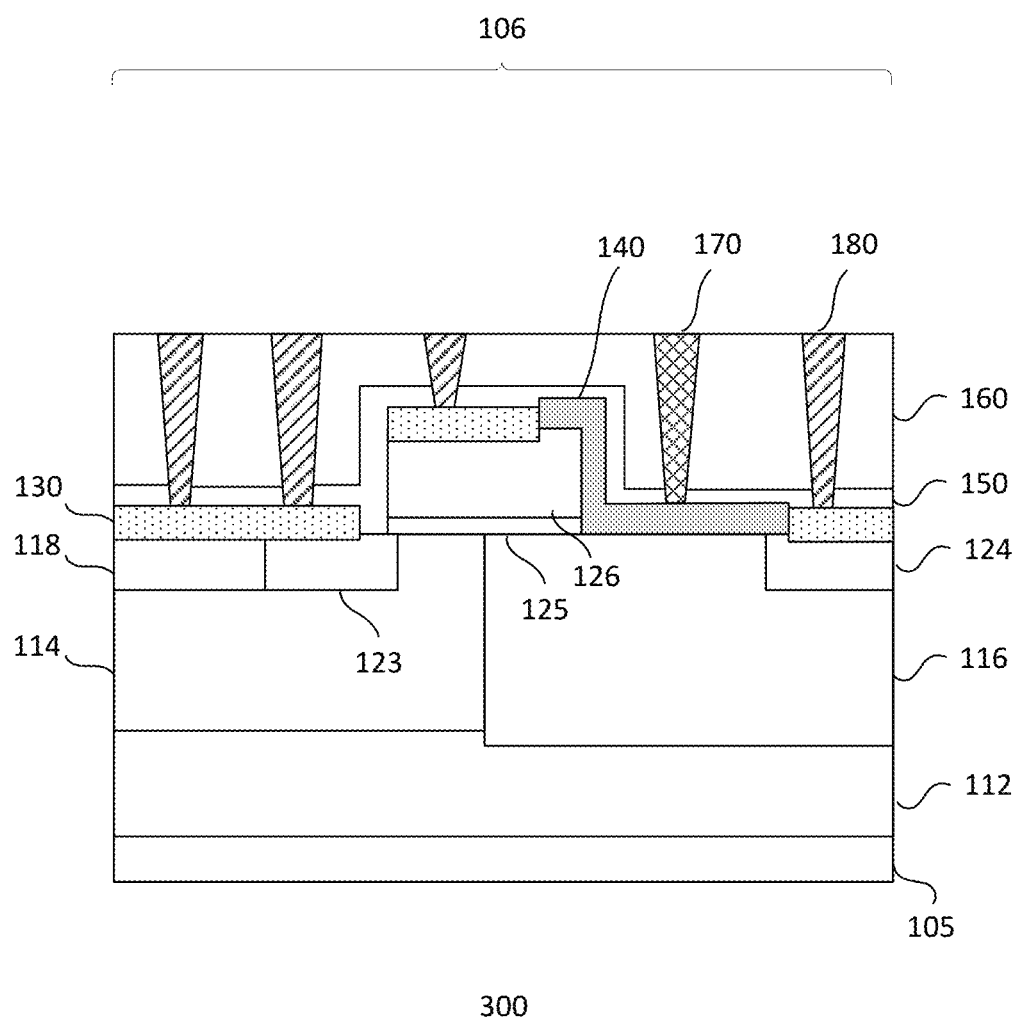

Referring to FIG. 3h, a field plate in the form of field plate contact 170 is formed in the first deep opening 274 and contact plugs 180 are formed in the second deep openings 284. For example, the openings are filled with a conductive material, such as tungsten. Other types of conductive materials may also be useful. Excess material is removed by, for example, chemical mechanical polishing (CMP) to form a planar top surface with the dielectric layer 160. As shown, the field plate contact 170 is coupled to the salicide block layer 140, whereas the contact plugs 180 are coupled to contact regions of the transistor. In one embodiment, the field plate contact is an elongated field plate contact in the form of a long strip with a narrow width which traverses the transistor along the z direction as shown in FIG. 2a. In another embodiment, the field plate contact is provided as a series of field plate contact plugs arranged along the z direction as shown in FIG. 2b.

The process continues to complete forming the device. For example, additional processes may be performed to complete the device. Such processes may include forming interconnect metal levels, final passivation, dicing, packaging and testing.

The embodiments as described result in various advantages. For example, the dielectric layer 160 serves as an etch mask for etching the nitride etch stop layer 150. Subsequently the SAB layer 140 acts as a stop layer during the etching of the nitride layer 150. This eliminates a need for an additional mask. Furthermore, the field plate in the form of field plate contact is formed simultaneously with the contact plugs which simplifies the fabrication process. All these advantages translate into a low manufacturing cost and shorten the time to market.

In addition, the field plate in the form of field plate contact is formed in the trench or via holes of the dielectric layer on the drain side of the gate mitigates the formation of electric field near the edge of the gate on the drain side, improving breakdown voltage of the device while keeping the linear current unaffected as compared to conventional EDMOS. The devices as described thus enable a higher breakdown voltage without sacrificing the linear drain current (Idlin), as compared to a EDMOS of the same size. Furthermore, the devices as described have a shorter current path as compared to an LDMOS with internal STI, reduces the on-resistance $R_{ON}$ which enhances the linear drain current (Idlin).

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
providing a substrate, wherein the substrate comprises a medium voltage (MV) device region, wherein the MV device region comprises
first, second, and third wells,
wherein the second and third wells are disposed in the first well, the second and third wells are distinct wells,
wherein the first well is lightly doped with first polarity type dopants, the second well is intermediately doped with second polarity type dopants and the third well is intermediately doped with first polarity type dopants, and
wherein the first well is a deep well, the second doped well is a body well, and the third doped well is a drift well;
forming a first polarity type transistor on the substrate in the MV device region, wherein the transistor comprises a gate, a source and a drain;
forming an insulation layer on the substrate, wherein the insulation layer is partially disposed on the gate and a sidewall of the gate, and wherein the drain is offset from the gate by the insulation layer;
forming an overlayer on the substrate covering the transistor and insulation layer; and
forming a field plate in the form of a field plate contact in the overlayer, wherein the field plate contact is disposed on and coupled to the insulation layer for mitigating the formation of electric field adjacent to drain side of the gate.

2. The method of claim 1 wherein the overlayer comprises an etch stop layer and a dielectric layer, and wherein the etch stop layer is disposed between the insulation layer and the dielectric layer.

3. The method of claim 1 wherein forming the overlayer on the substrate comprises forming a first opening in the dielectric layer.

4. The method of claim 3 wherein the first opening comprises a first elongated trench, and wherein forming the field plate in the form of a field plate contact comprises filling the first elongated trench with a conductive material.

5. The method of claim 1 wherein the field plate contact is a long strip which traverses the transistor in a direction perpendicular to a channel length of the transistor.

6. The method of claim 1 wherein the field plate contact comprises a series of field plate contact plugs arranged in a column in a direction perpendicular to a channel length of the transistor.

7. The method of claim 1 wherein forming the overlayer on the substrate comprises forming a plurality of second openings in the overlayer, wherein each of the second openings correspond to contact terminals of the transistor.

8. The method of claim 7 further comprising filling the plurality of second openings with a conductive material to form a plurality of contact plugs.

9. The method of claim 8 wherein the contact plugs are formed as a series of contact plugs arranged in a column in a direction perpendicular to a channel length of the transistor.

10. The method of claim 1 wherein the source is formed in the second doped well and the drain is formed in the drift well.

11. A method for forming a device comprising:
providing a substrate, wherein the substrate comprises a medium voltage (MV) device region, wherein the MV device region comprises
first, second, and third wells,
wherein the second and third wells are disposed in the first well, the second and third wells are distinct wells,
wherein the first well is lightly doped with first polarity type dopants, the second well is intermediately doped with second polarity type dopants and the third well is intermediately doped with first polarity type dopants, and
wherein the first well is a deep well, the second doped well is a body well, and the third doped well is a drift well;
forming a transistor on the substrate in the MV device region, wherein the transistor comprises a gate;
forming an insulation layer on the substrate, wherein the insulation layer is partially disposed on the gate and a sidewall of the gate;
forming an etch stop layer on the substrate, wherein the etch stop layer covers the transistor;
forming a dielectric layer over the etch stop layer; and
forming a field plate in the form of a field plate contact in the etch stop layer and dielectric layer, wherein the field plate contact is disposed on and coupled to the insulation layer.

12. The method of claim 11 further comprising forming a first opening in the etch stop layer and dielectric layer.

13. The method of claim 12 wherein forming the first opening in the etch stop layer and dielectric layer comprises:
etching the dielectric layer to form an elongated opening; and
etching the etch stop layer to form the first opening which corresponds to the elongated opening, wherein the etched dielectric layer serves as an etch mask.

14. The method of claim 13 further comprising filling the first opening with a conductive material to form the field plate contact.

15. The method of claim 11 further comprising forming a plurality of second openings in the etch stop layer and dielectric layer.

16. The method of claim 15 wherein forming the plurality of second openings in the etch stop layer and dielectric layer comprises:
etching the dielectric layer to form a plurality of via holes; and
etching the etch stop layer to form the plurality of second openings which correspond to the via holes, wherein the etched dielectric layer serves as an etch mask.

17. The method of claim 11 wherein the transistor comprises a drain and wherein the drain is offset from the gate by the insulation layer.

18. The method of claim 11 wherein the field plate contact is a long strip which traverses the transistor in a direction perpendicular to a channel length of the transistor.

19. A device comprising:
a substrate, wherein the substrate comprises a medium voltage (MV) device region, wherein the MV device region comprises
first, second, and third wells,
wherein the second and third wells are disposed in the first well, the second and third wells are distinct wells;
wherein the first well is lightly doped with first polarity type dopants, the second well is intermediately doped with second polarity type dopants and the third well is intermediately doped with first polarity type dopants, and
wherein the first well is a deep well, the second doped well is a body well, and the third doped well is a drift well; and
a transistor disposed on the substrate in the MV device region, wherein the transistor comprises a gate, a source and a drain;
an insulation layer disposed on the substrate, wherein the insulation layer is partially disposed on the gate and a sidewall of the gate, and wherein the drain is offset from the gate by the insulation layer;
an overlayer disposed on the substrate covering the transistor and insulation layer; and
a field plate in the form of a field plate contact disposed in the overlayer, wherein the field plate contact is disposed on and coupled to the insulation layer for mitigating the formation of electric field adjacent to drain side of the gate.

* * * * *